(12) United States Patent
Fandrich

(10) Patent No.: US 7,624,316 B2
(45) Date of Patent: Nov. 24, 2009

(54) APPARATUS AND METHOD FOR TESTING REMOVABLE FLASH MEMORY DEVICES

(75) Inventor: Mickey L. Fandrich, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 503 days.

(21) Appl. No.: 11/318,106

(22) Filed: Dec. 23, 2005

(65) Prior Publication Data

US 2007/0145363 A1   Jun. 28, 2007

(51) Int. Cl.
*G11C 29/00* (2006.01)
(52) U.S. Cl. .................................... 714/718
(58) Field of Classification Search ............. 714/718, 714/719
See application file for complete search history.

(56) References Cited

U.S. PATENT DOCUMENTS

| | | | | |
|---|---|---|---|---|
| 5,748,939 A * | 5/1998 | Rozman et al. | ............ | 711/103 |
| 5,959,914 A * | 9/1999 | Gates et al. | ................ | 365/201 |
| 6,499,122 B1 * | 12/2002 | Coomes | ...................... | 714/724 |
| 6,732,301 B1 * | 5/2004 | Landry et al. | ................. | 714/43 |
| 6,738,938 B2 * | 5/2004 | Nadeau-Dostie et al. | .... | 714/719 |
| 6,799,289 B2 * | 9/2004 | Totorica et al. | ............ | 714/718 |
| 6,826,720 B2 * | 11/2004 | Suzuki et al. | ............... | 714/720 |
| 7,020,815 B2 * | 3/2006 | Jeddeloh | ..................... | 714/718 |
| 7,137,037 B2 * | 11/2006 | Kuo et al. | ..................... | 714/42 |
| 7,171,596 B2 * | 1/2007 | Boehler | ...................... | 714/718 |
| 7,321,997 B2 * | 1/2008 | Zimmerman et al. | ....... | 714/718 |
| 7,350,108 B1 * | 3/2008 | Dean et al. | .................... | 714/27 |
| 7,395,472 B2 * | 7/2008 | Nilson | ........................ | 714/727 |
| 2002/0046374 A1 * | 4/2002 | Aoki et al. | ................... | 714/719 |
| 2007/0067684 A1 * | 3/2007 | Stolero et al. | .............. | 714/718 |

\* cited by examiner

*Primary Examiner*—James C Kerveros
(74) *Attorney, Agent, or Firm*—Trop, Pruner & Hu, P.C.

(57) ABSTRACT

A memory device may include a controller and a plurality of flash memory dice. The controller is provided for read and write access and communications with a host. However, the controller may also be utilized to test one or more of the flash memory dice mounted on the device. In this way, testing may be achieved with a relatively modestly priced tester by making use of the capabilities of the onboard controller. As a result, the cost of a memory device may be reduced in some cases.

20 Claims, 2 Drawing Sheets ness of programming and erasing each individual flash memory cell, and in order to ensure that the appropriate voltages are maintained, the controller may be utilized to test the candidate dice.

APPARATUS AND METHOD FOR TESTING REMOVABLE FLASH MEMORY DEVICES

BACKGROUND

This invention relates generally to testing integrated circuits and, particularly, to testing removable flash memory devices.

Removable flash memory devices may be utilized to transfer data from one location to another. Examples of removable memory devices include Universal Serial Bus (USB) flash drives, multi-media cards (MMC), secure digital cards (SD), memory stick cards, and xD picture cards, to mention a few examples.

Generally, these devices plug into a host and act as a storage medium for the host. Then, the device may be unplugged, taken to another location, plugged into another host, and the data stored thereon read so that the data can be transferred from host to host.

DETAILED DESCRIPTION

Figure 1:
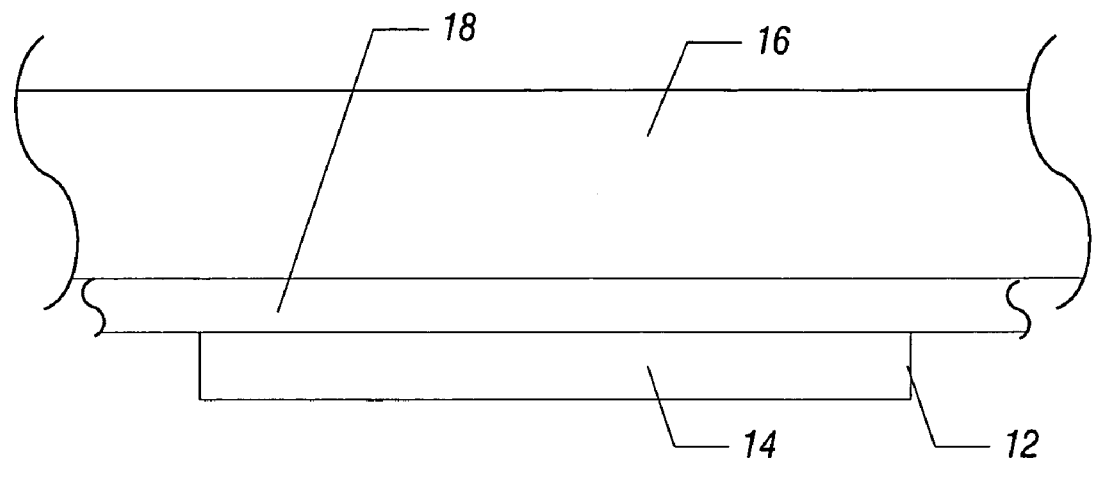
FIG. 1 is an enlarged, cross-sectional view of a removable memory device under test.

Referring to FIG. 1, a basic test device 16 may be coupled to a removable memory device 14 through a suitable interposer or interconnection device 18. The interposer or interconnection device 18 may be a cable, a set of contacts, a socket, a probe card, or other interposing or interconnecting devices.

The test device 16 may be a very basic tester which may be a low cost tester in some embodiments. The test device 16 need only provide power and a few minimal commands to the removable memory device 14. Since conventional testers are more elaborate and more expensive, cost savings may be achieved through the use of a relatively low cost tester.

Figure 2:
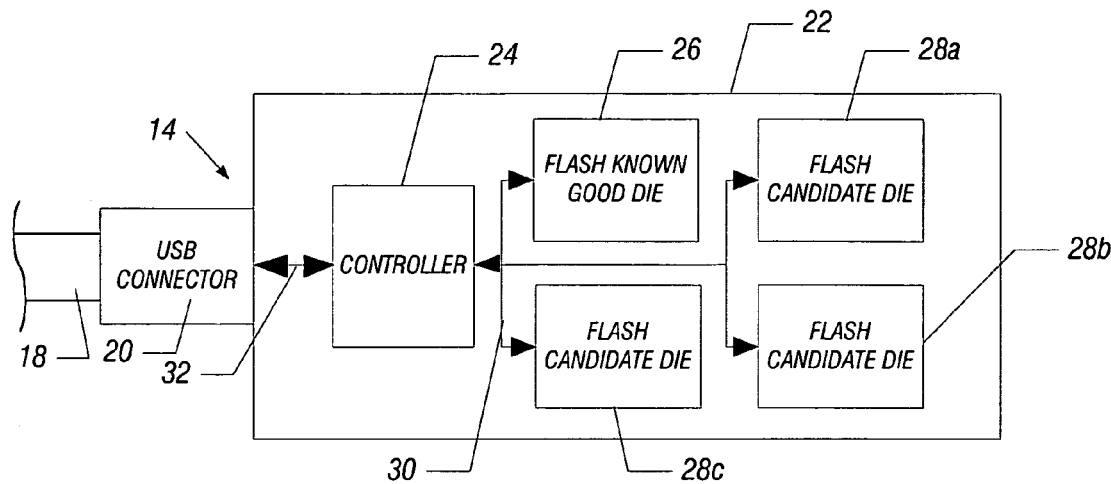
FIG. 2 is a depiction of a removable memory device in accordance with one embodiment of the present invention.

Referring to FIG. 2, the interconnection device 18 may be coupled to the removable memory device 14 by a connector 20. In one embodiment, the connector 20 may be a Universal Serial Bus connector. However, any connector which allows a pluggable connection to the tester would be useful in some embodiments of the present invention.

Removable memory device 14 may include a card 22 on which is mounted a microcontroller 24. The microcontroller 24 may communicate with the connector 20 to receive or send signals. The controller 24, in turn, is coupled to a first known good flash memory die 26. This is a flash memory die that has undergone complete electrical testing (using more expensive testers than the basic test device 16) and is known to be functional. Also coupled to the controller 24 are one or more additional candidate dice 28a, 28b, and 28c. These dice have not been completely tested prior to assembly on the card 22. While three such devices are shown in the illustrated embodiment, any number of such dice may be provided. The untested memory may be memory that has had limited testing, for example, some testing may have been performed on the memory, such as testing for opens and shorts, or basic functionality.

In accordance with some embodiments of the present invention, the test device 16 uses the controller 24 to electrically test, or to complete the testing of, the candidate dice 28. Thus, if none of the flash candidate dice 28 are functional (the worst case), the removable memory device 14 may be sold at a price that accounts for the fact that the device only has one functional memory die.

If one known good die were not included on the card 22, then the controller 24, printed circuit board, and other peripherals would be wasted as well if no die passed the electrical test. Thus, it is cost effective to provide one known good die 26, which has been thoroughly tested, on the same card 22 with the controller 24, to ensure that the card 22 and the controller 24 are still saleable, even if the candidate dice 28 are non-functional.

Figure 3:
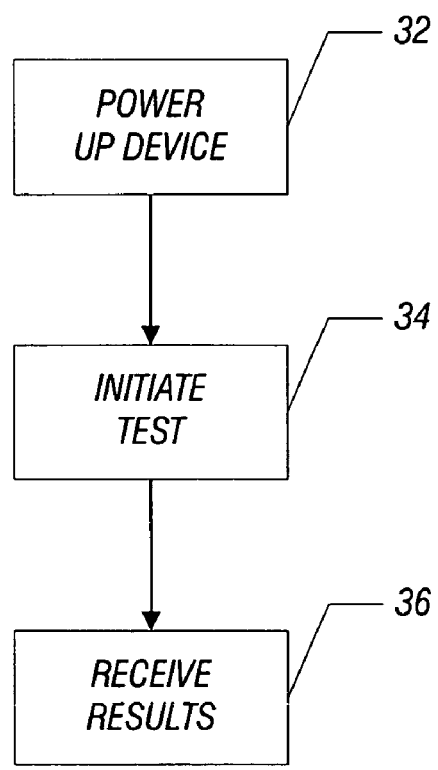
FIG. 3 is a flow chart for a test methodology in accordance with one embodiment of the present invention.

Referring to FIG. 3, the test sequence for the test device 16 is to power up, as indicated in block 32, then initiate the test of one of the dice 28, as indicated in block 34. It initiates the test by providing basic commands for the microcontroller 24 which then actually implements the test. The tester 16 also receives the results (block 36) of the test from the controller 24 over the connector 20 in some cases.

Figure 4:
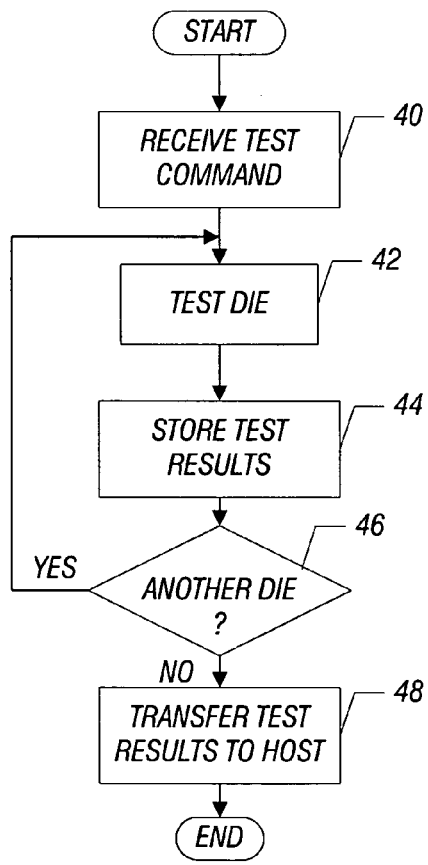
FIG. 4 is a flow chart for implementing one embodiment of the present invention.

A process used by the controller 24, such as the one shown in FIG. 4, may be implemented in hardware, software, or firmware. If the process is implemented in software, that software may be stored on the controller 24 or on the known good memory die 28, as two examples.

Initially, the controller 24 receives the test command (block 40) from the test device 16. In one embodiment, the test command may be as simple as a power up signal to the controller 24. The controller 24 may then execute code from the known good memory die 28 that establishes that, on initial power up, the candidate dice 28 are to be tested. On ensuing power up sequences, no such test may be done in some embodiments. Code pre-stored, for example on the known good die 26, may also give the addresses of the candidate dice 28 in one embodiment. In response to a signal from the test device 16, a test of the first candidate die 28a is initiated as indicated in block 42.

The controller 24 then may store the results of that test as indicated in block 44. At diamond 46, a check determines whether there is another candidate die on the card 22. If so, the next candidate die is tested. The sequence iterates until all of the dice 28 have been tested. Once there are no more candidate dice to be tested, as determined in diamond 46, the test results that have been stored by the controller 24 are transferred to the host, such as the tester 16, as indicated in block 48. Then, the test device 16, in one embodiment, merely turns off the controller 24. Thus, in one embodiment, all the test device 16 needs to do is turn on and off the controller 24. For example, a code may be reset or changed after initial power up to indicate thereafter that the dice 28 do not need to be tested.

Because the testing cost tends to be a major component of the cost of removable memory devices, by using the onboard controller 24 as the tester, significant cost savings may be achieved. This is because a much less expensive tester is utilized. The controller 24 is needed in any case for receiving commands from the host and reading data from and writing data to the flash memory in normal operation.

Once the test is complete, the tester 16 can appropriately bin the card 22. For example, depending on the storage capacity of the dice that are functional, the removable memory card 14 may be binned and priced accordingly.

References throughout this specification to "one embodiment" or "an embodiment" mean that a particular feature, structure, or characteristic described in connection with the embodiment is included in at least one implementation encompassed within the present invention. Thus, appearances of the phrase "one embodiment" or "in an embodiment" are not necessarily referring to the same embodiment. Furthermore, the particular features, structures, or characteristics may be instituted in other suitable forms other than the particular embodiment illustrated and all such forms may be encompassed within the claims of the present application.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
    using a controller in a device to test a flash memory die in said device; and
    forming the device with one already tested flash memory die and at least one untested flash memory die.

2. The method of claim 1 including determining how many dice to be tested are included in said device.

3. The method of claim 2 including testing said dice one at a time.

4. The method of claim 3 including determining when all of the dice have been tested.

5. The method of claim 4 including transferring test information from said device.

6. The method of claim 5 including binning said device based on the storage capacity of the functional dice in said device.

7. The method of claim 1 including using a controller in a removable memory device to test a flash memory die in said removable memory device.

8. The method of claim 1 including automatically testing said flash memory die on the first power up.

9. The method of claim 1 including transferring testing protocol information from the one already tested flash memory die to the controller to test the flash memory die.

10. An electronic device comprising:
    a substrate;
    a controller mounted on said substrate;
    a first electrically tested flash memory die coupled to said controller; and
    a second incompletely tested flash memory die coupled to said controller.

11. The device of claim 10 including at least two untested memory dice.

12. The device of claim 10 wherein said controller is adapted to test the untested memory die.

13. The device of claim 12 wherein said controller to receive a command from a tester to implement a test of said untested memory die.

14. The device of claim 13, said controller to store the results of said test and to transfer the results of said test to said tester.

15. The device of claim 13, said controller to identify the untested die on said substrate and to implement a test of said die upon command.

16. The device of claim 10 wherein said device is a removable memory device.

17. The device of claim 16, wherein the controller is adapted perform a test of the second incompletely tested flash memory die and a post-testing operable memory capacity of the device is to be based on the test results.

18. The device of claim 10 wherein said controller to automatically test said second untested flash memory die the first time said controller is powered on.

19. The device of claim 18 wherein after the first power on the controller does not test said second untested die.

20. The device of claim 10, said controller to implement an electrical test of an untested die on said substrate.

* * * * *